(12) United States Patent
Lan et al.

(10) Patent No.: US 9,744,624 B2
(45) Date of Patent: Aug. 29, 2017

(54) METHOD FOR MANUFACTURING CIRCUIT BOARD

(71) Applicant: KINSUS INTERCONNECT TECHNOLOGY CORP., Taoyuan (TW)

(72) Inventors: Jaen-Don Lan, New Taipei (TW);
Pin-Chung Lin, New Taipei (TW);
Chen-Rui Tseng, Taoyuan (TW);
Cheng-En Ho, New Taipei (TW);
Yu-An Chen, New Taipei (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 287 days.

(21) Appl. No.: 14/742,070

(22) Filed: Jun. 17, 2015

(65) Prior Publication Data

US 2016/0374206 A1 Dec. 22, 2016

(51) Int. Cl.
| | |
|---|---|
| *H05K 3/46* | (2006.01) |
| *B23K 26/402* | (2014.01) |
| *H05K 3/42* | (2006.01) |
| *B23K 26/382* | (2014.01) |
| *B23K 103/00* | (2006.01) |

(52) U.S. Cl.
CPC .......... *B23K 26/402* (2013.01); *B23K 26/389* (2015.10); *H05K 3/426* (2013.01); *H05K 3/4644* (2013.01); *B23K 2203/30* (2015.10); *B23K 2203/50* (2015.10); *H05K 2201/0341* (2013.01)

(58) Field of Classification Search
CPC B23K 26/389; B23K 26/402; B23K 2206/30; B23K 2203/50; H05K 3/426; H05K 3/4644; H05K 2201/0341
See application file for complete search history.

(56) References Cited

U.S. PATENT DOCUMENTS

| | | | |
|---|---|---|---|
| 8,205,329 B2 * | 6/2012 | Nakamura | H05K 1/162 29/25.41 |
| 2014/0060893 A1 * | 3/2014 | Lee | H05K 3/46 174/251 |

FOREIGN PATENT DOCUMENTS

JP    2008227153 A  * 9/2008

* cited by examiner

*Primary Examiner* — Carl Arbes
(74) *Attorney, Agent, or Firm* — Lin & Associates Intellectual Property, Inc.

(57) ABSTRACT

Disclosed is a method for manufacturing a circuit board, including preparing a substrate having a resin layer and a stop layer, forming at least one conduction hole penetrating the resin layer and stopping at the stop layer, forming a first metal layer through a sputtering process, forming a second metal layer on the first metal layer through a chemical plating process, forming a third metal layer having a circuit pattern, exposing part of the second metal layer and filling up the conduction hole through an electroplating process, and etching the second metal layer and the first metal layer under the second metal layer to expose the resin layer under the first metal layer. Since the first metal layer provides excellent surface properties, the second and third metal layers are well fixed and stable. The etched circuit pattern has a line width/pitch less than 10 μm for fine line width/pitch.

18 Claims, 9 Drawing Sheets

METHOD FOR MANUFACTURING CIRCUIT BOARD

BACKGROUND OF THE INVENTION

1. Field of the Invention

The present invention generally relates to a method for manufacturing a circuit board, and more specifically to a method for manufacturing a circuit board comprising a sputtering process, a chemical plating process and an electroplating process sequentially performed to form a first metal layer on a substrate, a second metal layer on the first metal layer and a third metal layer on the second metal layer, respectively, and further comprising a circuit etching process to form an electrical circuit with fine line width/pitch by etching the first and second metal layers.

2. The Prior Arts

Recently, as the technology of the VLSI (very large scale integrated circuit) made great progress, the connection circuit has become much smaller. For example, in the 22 nm semiconductor technology, both chip density and ability of signal processing are increasingly enhanced. As a result, the line width/pitch of the connection circuit needs smaller size, and the current equipments and processes for mass production encounter tough challenge. Additionally, to further increase package density, the chips are usually stacked together and then processed by the three dimensional package. At this time, the line width/pitch of the circuit substrate needs to be reduced to 30-50 μm from 100 μm. As for the requirements by the current manufactures for increasingly reducing the line width/pitch, the surface structure of the copper layer for the circuit pattern should meet more strict requirements. Generally, roughness Rz of the copper layer in the printed circuit board (PCB) is 5-7 μm, and roughness Rz of the substrate is less than 5 μm. However, for the line width/pitch about 10-20 μm, roughness Rz of the copper layer should be about 2 μm, or otherwise the circuit pattern is easily distorted to cause the circuit board to fail to normal function. Sometimes, the circuit pattern is short circuited due to some remaining copper such that high precision and reliability for electrical connection can be implemented.

In the prior arts, the semi additive process (SAP) is usually used to manufacture the electrical circuit pattern with the line width/pitch less than 50 μm. For the line width/pitch less than 25 μm, The SAP needs to use ABF resin provided by Ajinomoto Fine-Techno Co., Inc. as the insulation material, or a PCF (primer coated copper foil) and a semi solid sheet (called Prepreg) provided by Mitsubishi Gas Chemical Company, INC., Ltd. for the pressing process. As for the PCF, one rough surface of the copper foil is first covered with a resin layer with a thickness of 2-3 μm and then processed by semi solidification, and the semi solid sheet and the copper foil are pressed together. The copper foil is removed and the surface of the resin layer has specific roughness. Thus, the chemical copper plating process (or called the electroless plating process) can form the chemical plated copper layer with strong adhesion on the rough surface of the resin layer, thereby manufacturing more precise circuit pattern.

As an example for SAP using the PCF, the specific implementation includes first pressing the PCF onto the inner circuit layer, removing the copper on the PCF to remain the resin with highly specific surface feature, and performing the chemical plating process to form the circuit pattern layer with fine line width/pitch.

However, one of the shortcomings for the above methods in the prior arts is that the remaining resin is not stable after the PCF is removed such that the circuit pattern layer formed by the chemical plating process is easy to break, peel off due to weak adhesion. It is thus difficult to prevent the portion of the circuit patter layer filling up the blind holes as connection plug with a vertical shape from being shifted or distorted. As a result, the electrical property and reliability of the electrical circuit of the circuit board are adversely affected.

Therefore, it is greatly needed to provide a new method for manufacturing a circuit board, which generally comprises a sputtering process for forming a first metal layer on a substrate, a chemical plating process for forming a second metal layer on the first metal layer, an electroplating process for forming a third metal layer on the second metal layer, and a circuit etching process for forming an electrical circuit with fine line width/pitch by etching the first and second metal layers, thereby overcoming the above problems in the prior arts.

SUMMARY OF THE INVENTION

The primary objective of the present invention is to provide a method for manufacturing a circuit board with fine line width/pitch to improve precision of the electrical circuit of the circuit board.

First, the method of the present invention starts by preparing a substrate, which has a stop layer and a resin layer. The stop layer has a pattern and the resin layer is provided on the substrate. The upper surface of the resin layer has a roughness specified by Ra=0-1 μm and Rz=–10 μm. The stop layer is preferably formed of a metal or an alloy.

Next, at least one conduction hole penetrating the resin layer is formed by a laser drilling process or a mechanical drilling process. The conduction hole is a blind hole, and stops at the stop layer. That is, the conduction hole does not enter the stop layer. In addition, the conduction hole can be formed by first forming the resist layer with a specific pattern on the resin layer, and then using the resist layer as a mask for performing the laser drilling process by means of laser etching.

The first metal layer is then formed on the resin layer and covers the surface of the conduction hole through the sputtering process. The chemical plating process or an electroless plating process is performed to form the second metal layer covering the first metal layer. Next, the third metal layer is formed on the second metal layer through the electroplating process. Specifically, the third metal layer has a circuit pattern, which exposes part of the second metal layer and fills up the conduction hole such that the first, second and third metal layers are electrically connected together.

Finally, the exposed second metal layer is etched and the first metal layer under the exposed second metal layer is then etched to expose the resin layer under the first metal layer. Therefore, the circuit board is finished.

Furthermore, the resin layer is formed of a resin base material, and the resin layer may comprise the reinforcing material, which is uniformly dispersed in the resin base material. Preferably, the reinforcing material comprises glass fiber or carbon fiber so as to reinforce the mechanical strength of the whole structure and avoid warping or bending.

Moreover, the upper surface of the resin layer can be covered with the copper layer before the conduction hole is formed. The copper layer is treated by the pretreatment process such as the black process or the brown process for oxidizing the surface of the copper layer. Then, the laser etching process is performed to form the conduction hole. The upper surface and/or the lower surface of the substrate can be embedded with the inner circuit layer, which is formed of an electrically conductive metal and has an electrical pattern.

More specifically, the first metal layer may comprise the upper metal layer and the lower metal layer. The upper metal layer is stacked on the lower metal layer, and the lower metal layer is stacked on the exposed inner circuit layer. Preferably, the upper metal layer comprises copper (Cu), the lower metal layer comprises titanium (Ti), chromium (Cr) or tantalum (Ta), and the second and third metal layers comprise copper. The first metal layer may further comprise the bottom metal layer, which is provided under the lower metal layer and in contact with the exposed inner circuit layer. The bottom metal layer comprises titanium nitride (TiN).

Another objective of the present invention is to provide a method for manufacturing a circuit board, comprising steps of preparing the substrate, forming at least one conduction hole, forming the first, second and third metal layers, and circuit etching. Each of the upper and lower surfaces of the substrate is covers with the resin layer. The conduction hole is the through-hole penetrating the substrate, and the first, second and third metal layers are sequentially stacked on the upper and lower surfaces of the substrate and the surface of the through-hole. The third metal layer has a circuit pattern, which exposes part of the second metal layer and fills up the conduction hole. In particular, the first and second metal layers are etched by use of the circuit pattern of the third metal layer so as to expose part of the resin layer under the first metal layer.

Specifically, the method of the present invention can manufacture the circuit board having fine line width/pitch less than 10 μm so as to greatly improve electrical quality. Particularly, the processing steps of the method are simple and easy to implement, and the manufacturing cost is reduced, thereby providing the advantage of lower cost and meeting the requirements of fine line width/pitch by the application field of packaging electronic devices in consuming electronic products.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
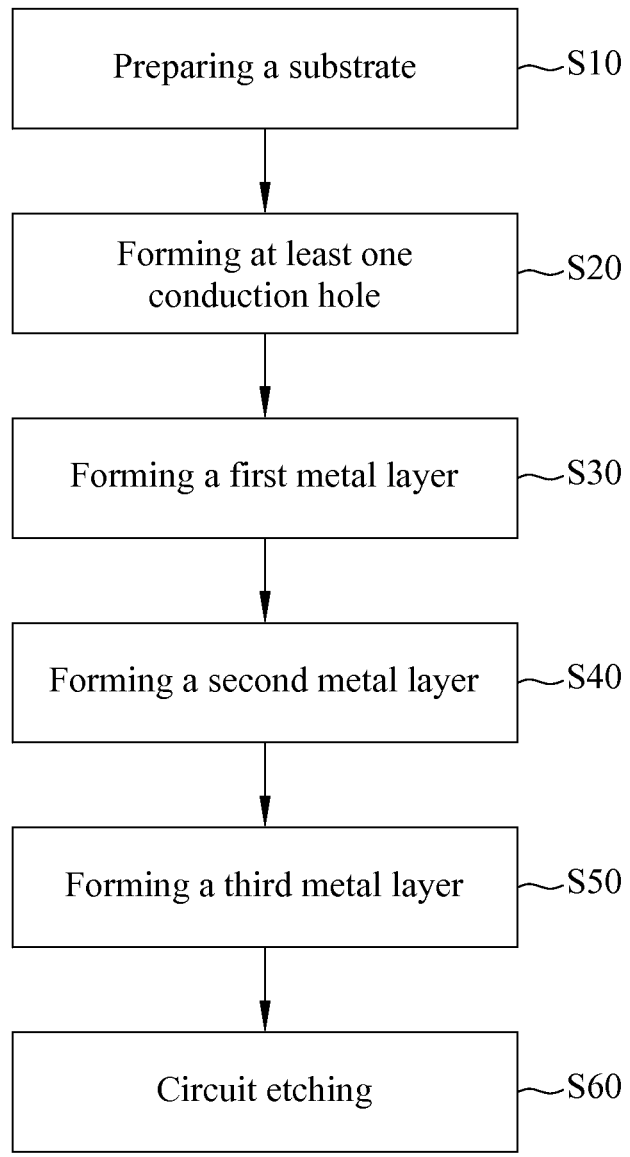
FIG. 1 is a flowchart showing a method for manufacturing a circuit board according to the first embodiment of the present invention.

Please refer to FIG. 1 illustrating the processing steps of the method for manufacturing a circuit board according to the first embodiment of the present invention. As shown in FIG. 1, the method of the first embodiment generally comprises the processing steps S10, S20, S24, S30, S40, S50 and S60, which are sequentially performed for manufacturing the circuit board with fine line width/pitch. Additionally, to further clearly understand the technical characteristics of the present invention, refer to FIGS. 2A to 2F, which are schematic views illustrating the respective processing steps of the method of the first embodiment of the present invention.

Figure 2A:
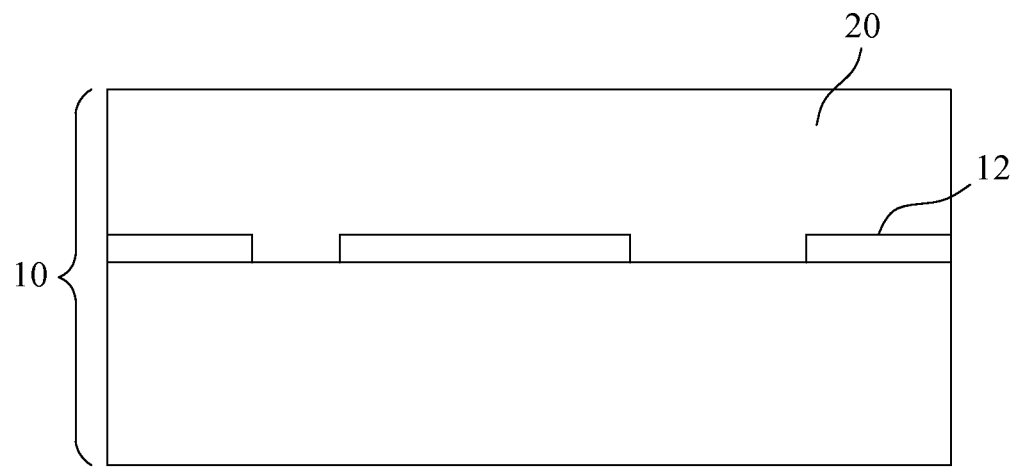
FIGS. 2A to 2F are views showing the respective processing steps of the method of the first embodiment of the present invention.

First, the method of the first embodiment begins at the step S10, in which the substrate 10 is prepared. As shown in FIG. 2A, the substrate 10 is covered by the stop layer 12 and the resin layer 20, wherein the stop layer 12 has a pattern, and the stop layer 12 is covered by the resin layer 20. In other words, a part of the substrate 10 is in contact with the resin layer 20. The stop layer 12 is formed of a metal or an alloy. The resin layer 20 can be formed by the pressing process, but the present invention is not limited by this process. That is, the resin layer 20 can be formed by other processes like coating or spraying. In particular, the resin layer 20 is formed of the resin base material, which may comprise epoxy resin, FR4, FR5, modified FR4 silicon, BT resin, polyphenylene oxide (PPO), polyimide (PI), Ajinomoto build-up film (ABF), polypropylene (PP) or photo imageable dielectric material (PIDM). Also, the upper surface of the resin layer 20 has a roughness specified by Ra=0-1 μm and Rz=-10 μm.

Figure 2B:
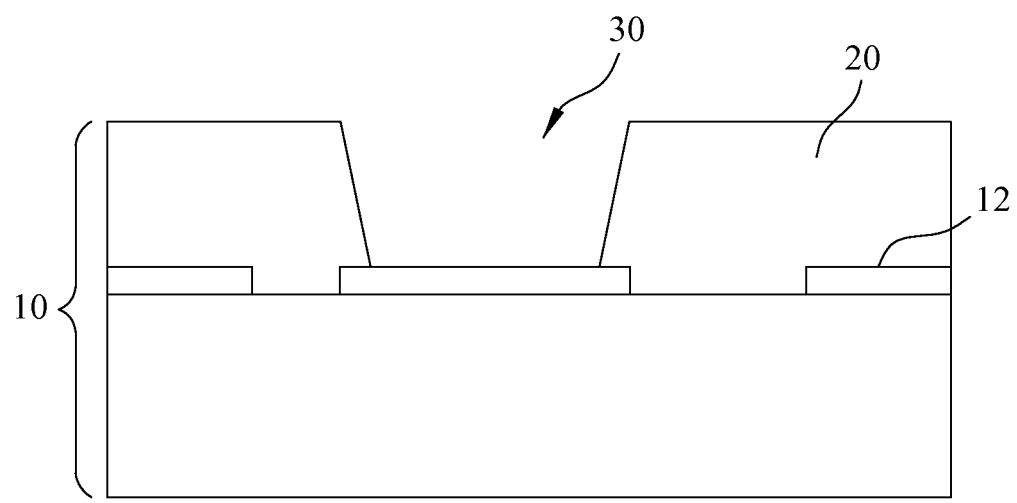

Next, the step S20 is performed as shown in FIG. 2B. At least one conduction hole 30 is formed by the laser drilling process or the mechanical drilling process. Specifically, the conduction hole 30 is the blind hole, which penetrates the resin layer 20 but does not enter the stop layer 12. In other words, the conduction hole 30 stops at the surface of the stop layer 12. The conduction hole 30 can be formed directly by the laser drilling process using a laser beam, but the present invention is not limited by this exemplary process. That is, the conduction hole 30 can be formed by first forming the resist layer (not shown) with a specific pattern on the resin layer 20, and then using the resist layer as a mask for performing the laser drilling process by means of laser etching.

Figure 2C:
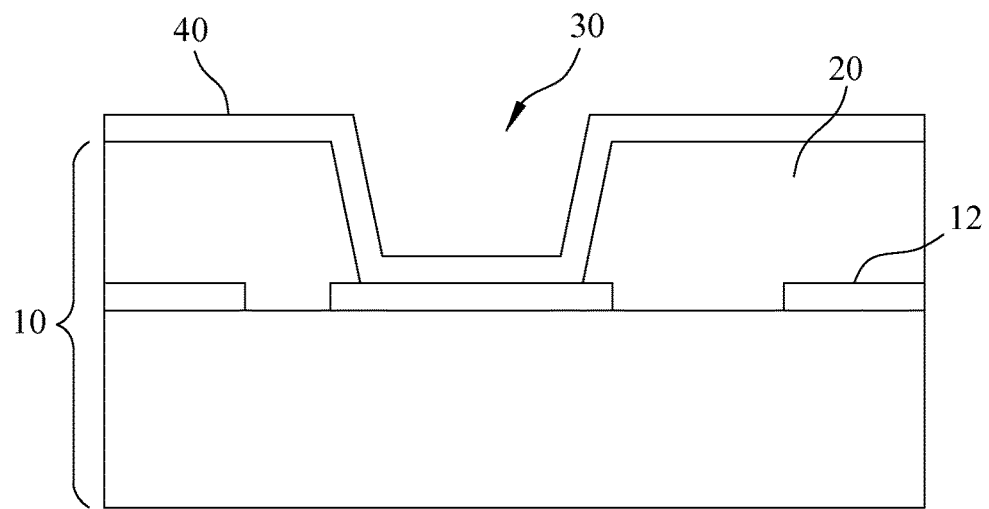

The step S30 is then performed as shown in FIG. 2C. The first metal layer 40 is formed on the resin layer 20 through the sputtering process, and also covers the surface of the conduction hole 30.

Figure 2D:
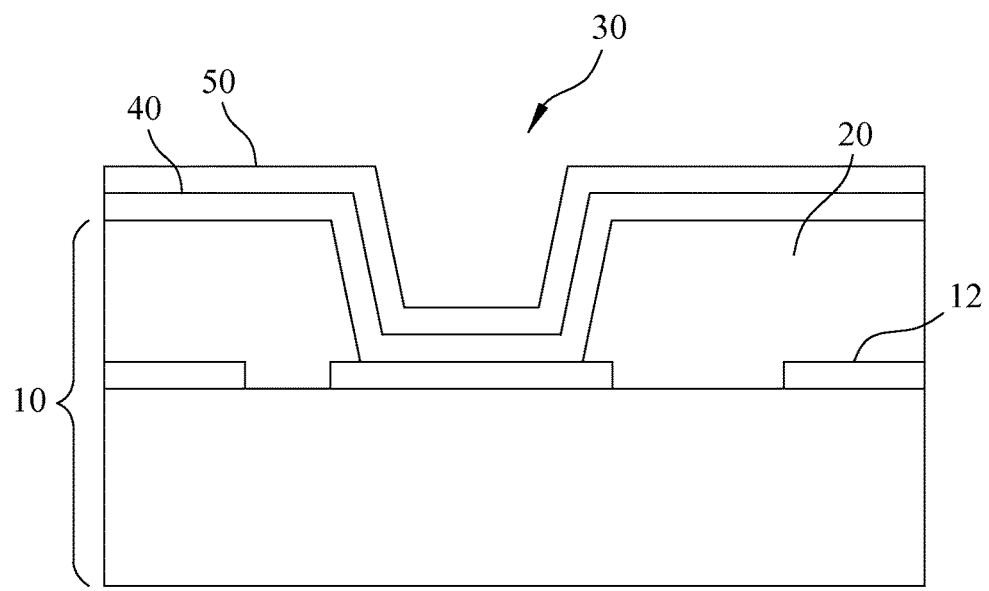

As shown in FIG. 2D, the step S40 is executed by forming the second metal layer 50 on the first metal layer 40 through the chemical plating process or the electroless plating process.

Figure 2E:
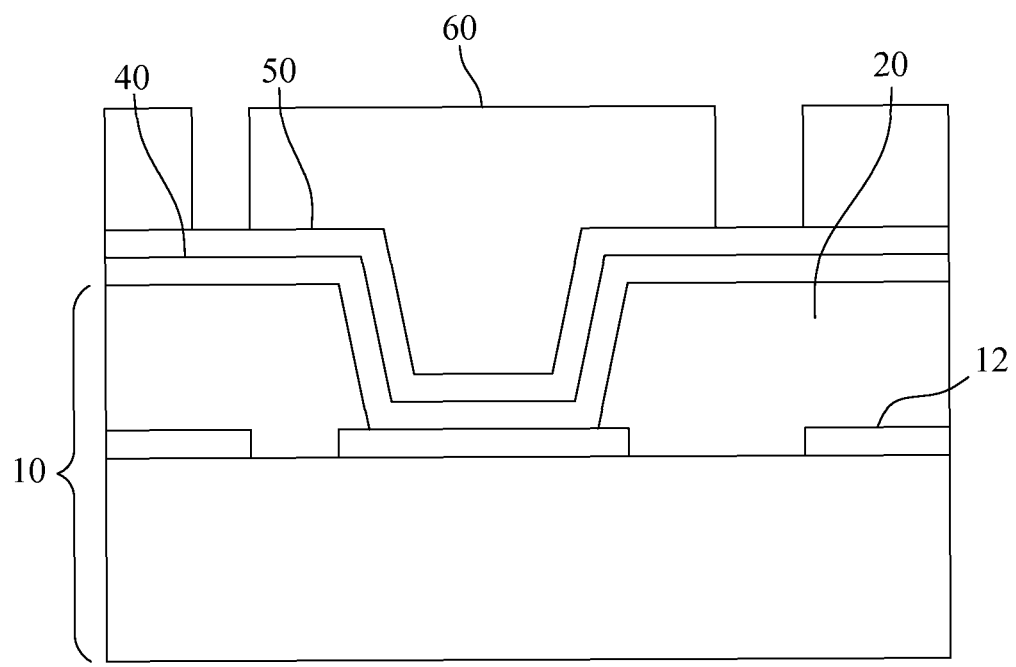

In the step S50, the electroplating process is used to form the third metal layer 60 on the second metal layer 50, as shown in FIG. 2E. The third metal layer 60 has the specific circuit pattern, which exposes part of the second metal layer 50 and fills up the conduction hole 30 such that the first metal layer 40, the second metal layer 50 and the third metal layer 60 are electrically connected.

Figure 2F:
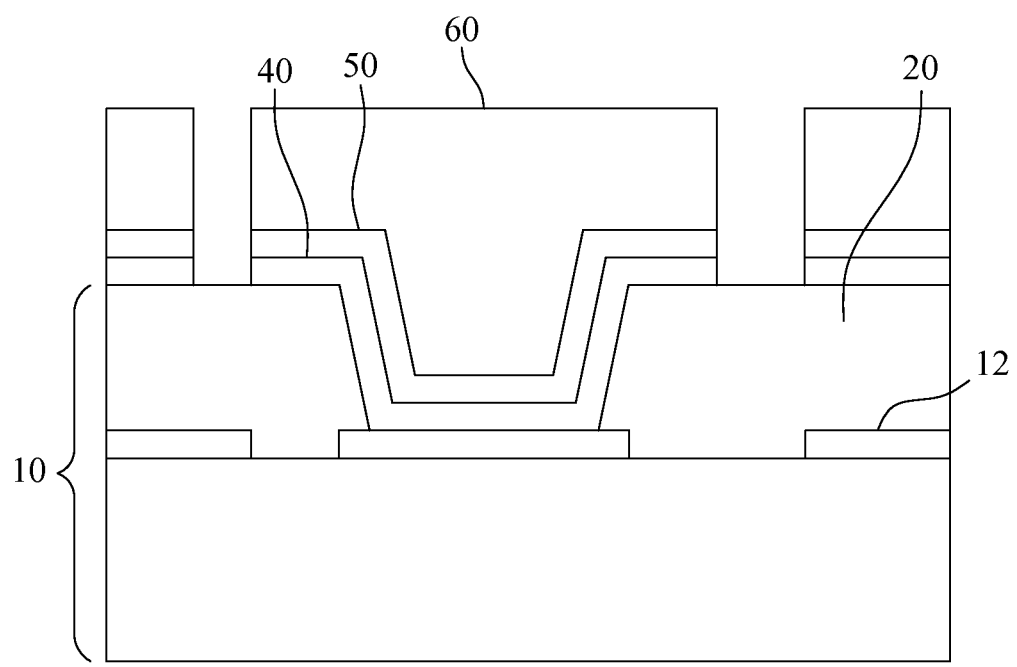

Finally, the step S60 is performed as shown in FIG. 2F by etching the exposed second metal layer 50 and the first metal layer 40 under the exposed second metal layer 50 to expose the resin layer 20 under the first metal layer 40. Therefore, the circuit board as desired is finished.

The above resin layer 20 may further comprise the reinforcing material (not shown) uniformly dispersed in the resin base material. The reinforcing material preferably comprises glass fiber or carbon fiber to reinforce the mechanical strength of the whole structure and avoid warping, bending or distortion.

Additionally, in the Step S10 of preparing the substrate 10, the upper surface of the resin layer 20 can be covered with the copper layer (not shown), and in the step S30 of forming the conduction hole 30, the copper layer is first treated by the pretreatment process like the black process or the brown process to oxidize the surface of the copper layer. Then, the laser etching process is used to form the conduction hole 30.

Also, the upper surface and/or the lower surface of the substrate 10 can be embedded with the inner circuit layer (not shown), which is formed of an electrically conductive metal and has an electrical pattern.

More specifically, the first metal layer 40 may comprise the upper metal layer and the lower metal layer (not shown). The upper metal layer is stacked on the lower metal layer, and the lower metal layer is stacked on the exposed inner circuit layer because the conduction hole 30 formed in the step S20 exposes part of the inner circuit layer. It is preferred that the upper metal layer comprises copper (Cu), the lower metal layer comprises titanium (Ti), chromium (Cr) or tantalum (Ta), and the second metal layer 50 and the third metal layer 60 comprise copper.

Moreover, the first metal layer further comprises the bottom metal layer (not shown), which is provided under the lower metal layer and in contact with the exposed inner circuit layer. In particular, the bottom metal layer comprises titanium nitride (TiN).

Additionally, the present invention provides the method of the second embodiment for manufacturing a circuit board. The method of the second embodiment is similar to the first embodiment as shown in FIG. 1, comprising the processing steps S10, S20, S24, S30, S40, S50 and S60 sequentially performed for manufacturing the circuit board with fine line width/pitch. To clearly describe the method of the second embodiment, refer to FIGS. 3A to 3F.

Figure 3A:
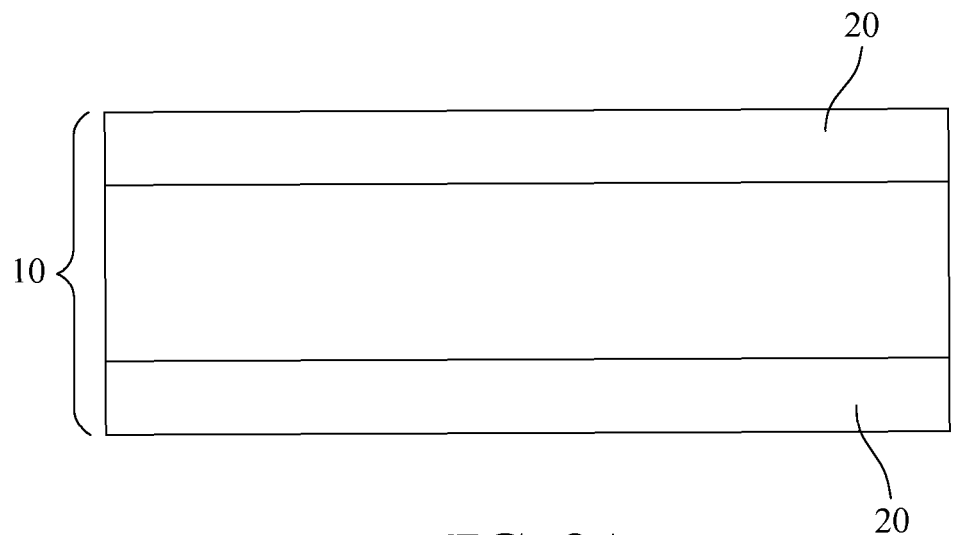
FIGS. 3A to 3F are views showing the respective processing steps of the method of the second embodiment of the present invention.
Figure 3B:
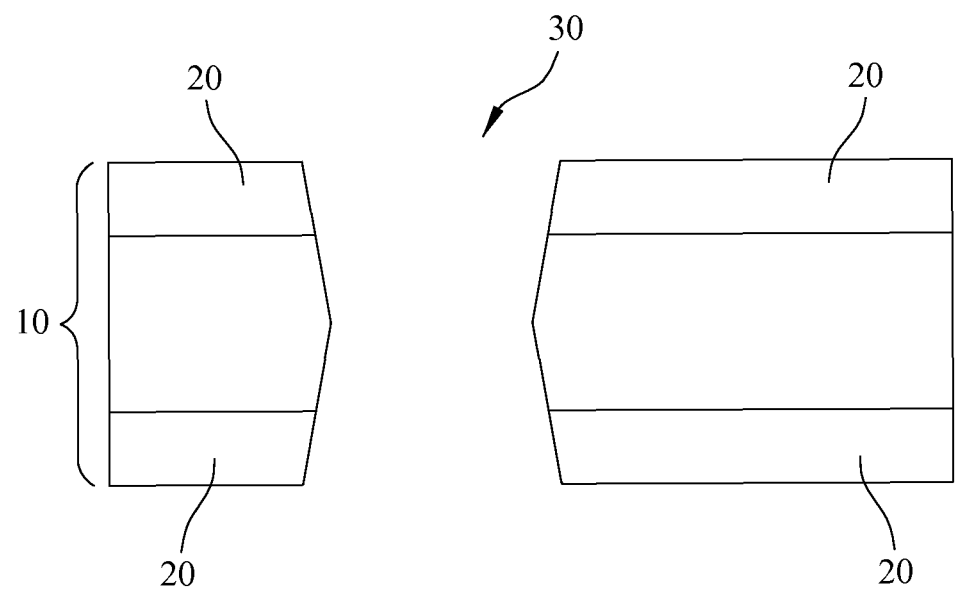

First, the step S10 is performed by preparing the substrate 10. Each of the upper and lower surfaces of the substrate 10 is covered with the resin layer 20, as shown in FIG. 3A. The laser drilling process or the mechanical drilling process is then performed in the step S20 to form at least one conduction hole 30 penetrating the substrate 10 and the resin layers 20 on the upper and lower surfaces of the substrate 10, as shown in FIG. 3B. It is obvious that the conduction hole 30 is substantially a through-hole.

Figure 3C:
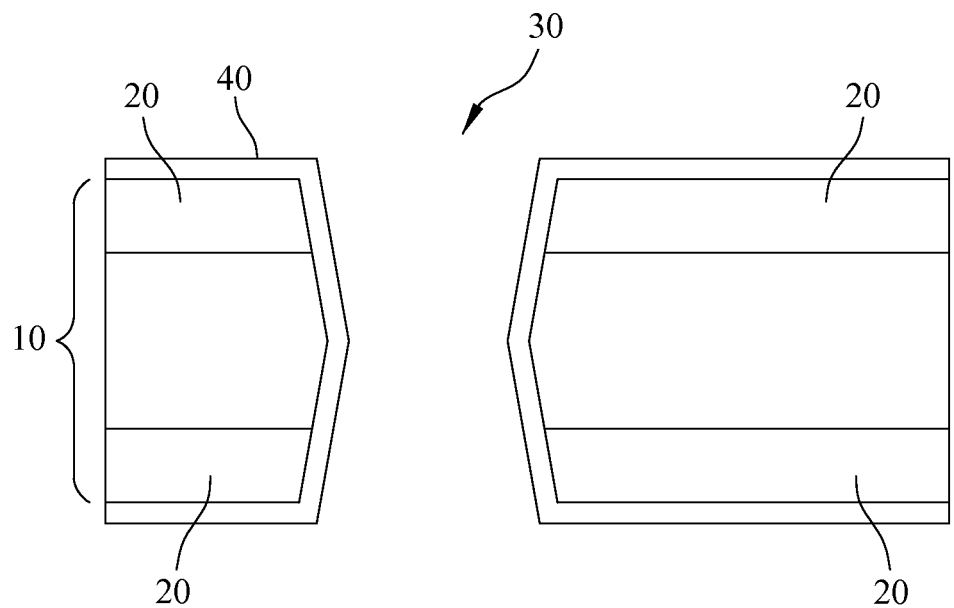
Figure 3D:
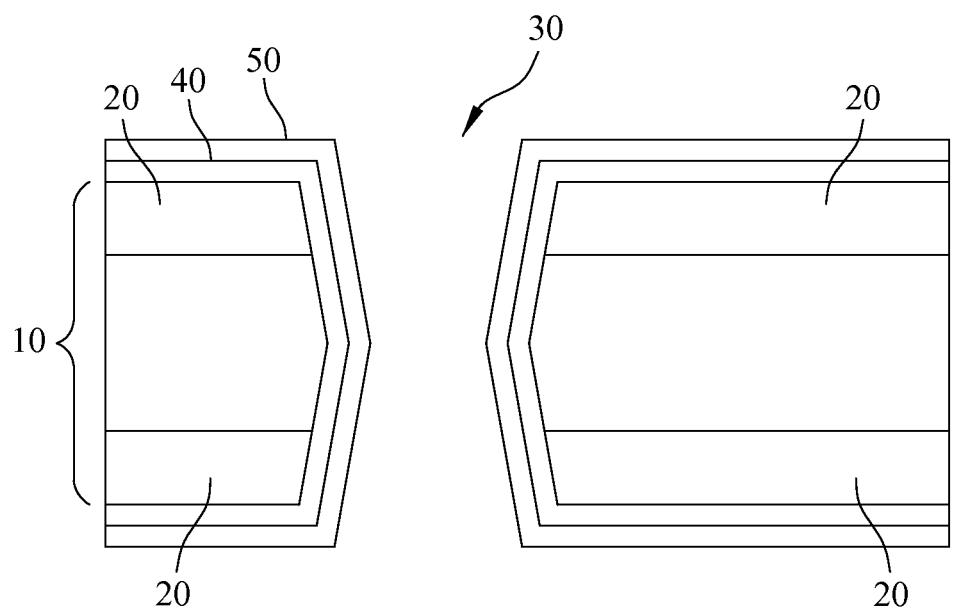
Figure 3E:
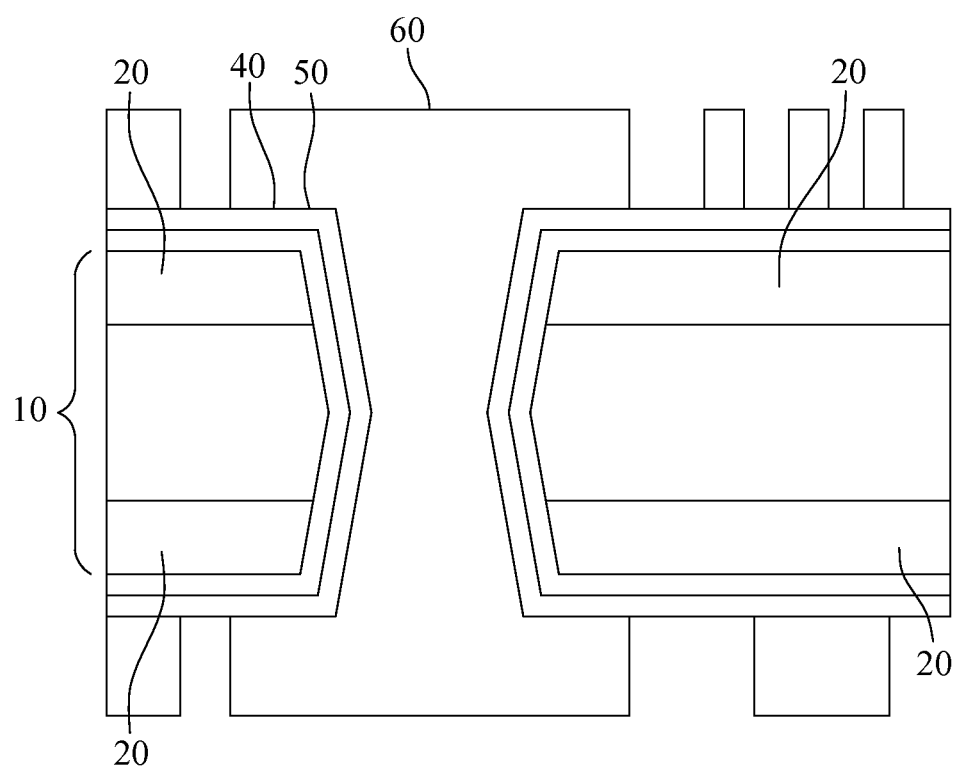

Next, as shown in FIG. 3C, the sputtering process is used to form the first metal layer 40 on the resin layer 20 in the step S30. The first metal layer 40 also covers the surface of the conduction hole 30. The second metal layer 50 is formed on the first metal layer 40 through the chemical plating process or the electroless plating process in step S40, as shown in FIG. 3D. The step S50 is then performed by forming the third metal layer 60 on the second metal layer 50 through the electroplating process. Specifically, the third metal layer 60 has a circuit pattern, which exposes part of the second metal layer 50 and fills up the at least one conduction hole 30 so as to electrically connect the first, second and third metal layers 40, 50 and 60.

Figure 3F:
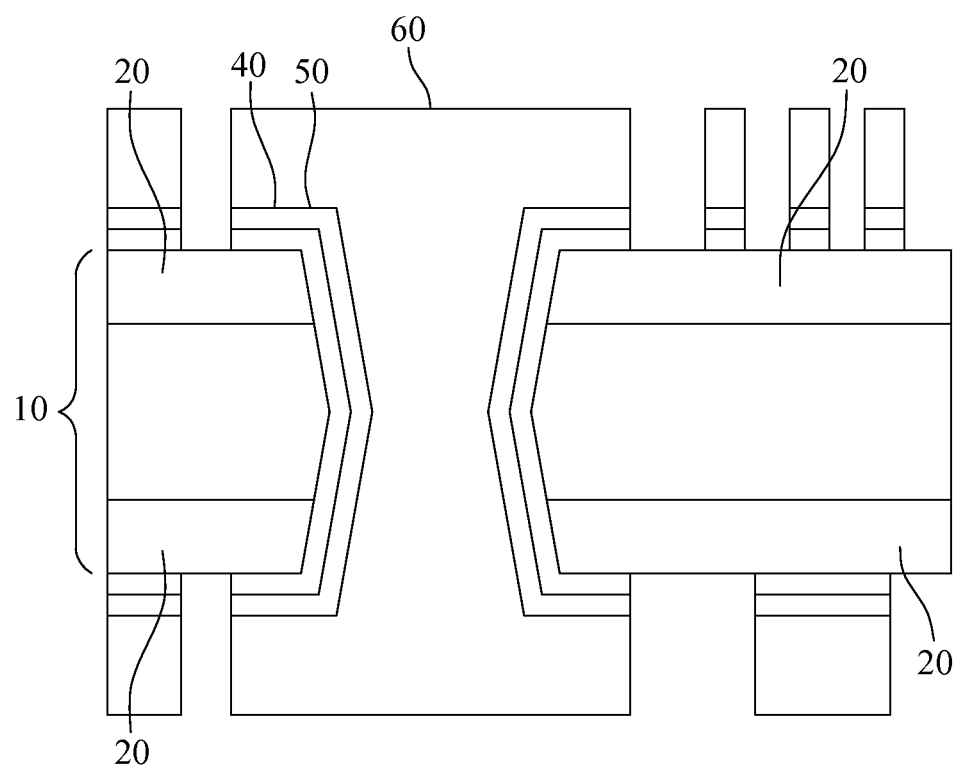

Finally, as shown in FIG. 3F, the exposed second metal layer 50 is etched in the step S60, and the first metal layer 40 under the exposed second metal layer 50 is also etched to expose the resin layer 20 under the first metal layer 40. The circuit board is thus manufactured.

Other elements of the second embodiment are similar to the elements of the first embodiment, and are thus not described hereinafter.

From the above mention, one primary feature of the present invention is that the sputtering process forms the first metal layer strongly adhesive to the resin layer, the chemical plating process forms the second metal layer on the first metal layer, and the electroplating process forms the third metal layer covering the second metal layer and filling up the conduction hole. Since the first metal layer provides excellent surface property, the second and third metal layers are more stable and well fixed such that the circuit later formed by etching has fine line width/pitch less than 10 μm. Thus, the requirements of fine line width/pitch by the application field of packaging electronic devices in consuming electronic products are met.

In particular, the first metal layer comprises the upper metal layer formed of copper or aluminum which is easily oxidized, and the lower metal layer formed of titanium, chromium or tantalum, such that the subsequent processes are easy to proceed and quality of the circuit board is greatly improved. Additionally, the first metal layer may further comprise the bottom metal layer formed of titanium nitride and provided under the lower metal layer for connecting the inner circuit layer. Accordingly, the mechanical strength of the first metal layer and the adhesion between the first metal layer and the inner circuit layer are greatly increased. Also, the second metal layer can be used as the inter conduction layer, and the third metal layer can increase the whole metal thickness and fill up the conduction hole.

Therefore, the circuit board manufactured by the method of the present invention indeed has high stability and reliability, thereby overcoming the problems in the prior arts.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for manufacturing a circuit board, comprising:
preparing a substrate covered by a stop layer having a pattern, the stop layer covered by a resin layer, part of the substrate is in contact with the resin layer, the stop layer formed of a metal or an alloy;
forming at least one conduction hole penetrating the resin layer by a laser drilling process or a mechanical drilling process, the at least one conduction hole not entering the stop layer but stopping at a surface of the stop layer so as to expose part of the stop layer via the at least one conduction hole, the at least one hole being a blind hole;
forming a first metal layer on the resin layer and the exposed stop layer through a sputtering process;
forming a second metal layer on the first metal layer through a chemical plating process or an electroless plating process;
forming a third metal layer on the second metal layer through an electroplating process, the third metal layer having a circuit pattern exposing part of the second metal layer and filling up the at least one conduction hole so as to electrically connect the first, second and third metal layers; and etching the exposed second metal layer and the first metal layer under the exposed second metal layer to expose the resin layer under the first metal layer so as to finish the circuit board.

2. The method as claimed in claim 1, wherein the at least one conduction hole is formed directly by the laser drilling process using a laser beam.

3. The method as claimed in claim 1, wherein the at least one conduction hole is formed by first forming a resist layer with a specific pattern on the resin layer, and then using the resist layer as a mask for performing the laser drilling process using a means of laser etching.

4. The method as claimed in claim 1, wherein an upper surface of the resin layer is covered with a copper layer before forming the at least one conduction hole, the copper layer is treated by a pretreatment process comprising a black process or a brown process for oxidizing a surface of the copper layer, and a laser etching process is performed to form the at least one conduction hole.

5. The method as claimed in claim 1, wherein the resin layer is formed of a resin base material comprising epoxy resin, FR4, FR5, modified FR4 silicon, BT resin, polyphenylene oxide (PPO), polyimide (PI), Ajinomoto build-up film (ABF), polypropylene (PP) or photo imageable dielectric material (PIDM), and the upper surface of the resin layer has a roughness specified by Ra=0-1 μm and Rz=–10 μm.

6. The method as claimed in claim 1, wherein an upper surface and/or a lower surface of the substrate is embedded with an inner circuit layer.

7. The method as claimed in claim 6, wherein the first metal layer comprises an upper metal layer and a lower metal layer, the upper metal layer is stacked on the lower metal layer, the lower metal layer is stacked on the exposed inner circuit layer, the upper metal layer comprises copper (Cu), the lower metal layer comprises titanium (Ti), chromium (Cr) or tantalum (Ta), and the second and third metal layers comprise copper.

8. The method as claimed in claim 7, wherein the first metal layer further comprises a bottom metal layer provided under the lower metal layer and being in contact with the exposed inner circuit layer, and the bottom metal layer comprises titanium nitride (TiN).

9. The method as claimed in claim 5, wherein the resin layer further comprises a reinforcing material uniformly dispersed in the resin base material, and the reinforcing material comprises glass fiber or carbon fiber.

10. A method for manufacturing a circuit board, comprising:

preparing a substrate having an upper surface and a lower surface covered by resin layers, respectively;

forming at least one conduction hole by a laser drilling process or a mechanical drilling process, the at least one conduction hole being a through-hole penetrating the substrate and the resin layers covering the upper and lower surfaces of the substrate;

forming a first metal layer on the resin layer through a sputtering process;

forming a second metal layer on the first metal layer through a chemical plating process or an electroless plating process;

forming a third metal layer on the second metal layer through an electroplating process, the third metal layer having a circuit pattern exposing part of the second metal layer and filling up the at least one conduction hole so as to electrically connect the first, second and third metal layers; and etching the exposed second metal layer and the first metal layer under the exposed second metal layer to expose the resin layer under the first metal layer so as to finish the circuit board.

11. The method as claimed in claim 10, wherein the at least one conduction hole is formed directly by the laser drilling process using a laser beam.

12. The method as claimed in claim 10, wherein the at least one conduction hole is formed by first forming a resist layer with a specific pattern on the resin layer, and then using the resist layer as a mask for performing the laser drilling process using a means of laser etching.

13. The method as claimed in claim 10, wherein an upper surface of the resin layer is covered with a copper layer before forming the at least one conduction hole, the copper layer is treated by a pretreatment process comprising a black process or a brown process for oxidizing a surface of the copper layer, and a laser etching process is performed to form the at least one conduction hole.

14. The method as claimed in claim 10, wherein the resin layer is formed of a resin base material comprising epoxy resin, FR4, FR5, modified FR4 silicon, BT resin, PPO, PI, ABF, PP or PIDM, and the upper surface of the resin layer has a roughness specified by Ra=0-1 μm and Rz=–10 μm.

15. The method as claimed in claim 10, wherein an upper surface and/or a lower surface of the substrate is embedded with an inner circuit layer.

16. The method as claimed in claim 15, wherein the first metal layer comprises an upper metal layer and a lower metal layer, the upper metal layer is stacked on the lower metal layer, the lower metal layer is stacked on the exposed inner circuit layer, the upper metal layer comprises copper, the lower metal layer comprises titanium, chromium or tantalum, and the second and third metal layers comprise copper.

17. The method as claimed in claim 16, wherein the first metal layer further comprises a bottom metal layer provided under the lower metal layer and being in contact with the exposed inner circuit layer, and the bottom metal layer comprises titanium nitride.

18. The method as claimed in claim 10, wherein the resin layer further comprises a reinforcing material uniformly dispersed in the resin base material, and the reinforcing material comprises glass fiber or carbon fiber.

* * * * *